(12) United States Patent
Starr (10) Patent No.: US 6,188,238 B1
(45) Date of Patent: Feb. 13, 2001

(54) METHOD FOR OPERATING AN INFORMATION HANDLING SYSTEM

(75) Inventor: Jonathan E. Starr, Cupertino, CA (US)

(73) Assignee: Sun Microsystems. Inc., Palo Alto, CA (US)

( * ) Notice: Under 35 U.S.C. 154(b), the term of this patent shall be extended for 0 days.

(21) Appl. No.: 09/316,456

(22) Filed: May 21, 1999

Related U.S. Application Data (63) Continuation-in-part of application No. 08/881,925, filed on Jun. 25, 1997, now Pat. No. 5,982,191.

(51) Int. Cl.[7] .................................................. H03K 17/16
(52) U.S. Cl. .................................. 326/30; 326/26; 326/86
(58) Field of Search ................................ 326/26, 27, 30, 326/83, 86

(56) References Cited

U.S. PATENT DOCUMENTS

| | | | |
|---|---|---|---|
| 5,530,377 | * 6/1996 | Walls | 326/30 |
| 5,532,630 | * 7/1996 | Waggoner et al. | 326/30 |
| 5,592,104 | * 1/1997 | Bach | 326/27 |
| 5,686,872 | * 11/1997 | Fried | 326/30 |
| 5,705,937 | * 1/1998 | Yap | 326/30 |
| 5,731,711 | * 3/1998 | Gabara | 326/30 |
| 6,026,456 | * 2/2000 | Iikbahar | 326/30 |
| 6,084,424 | * 7/2000 | Gasparik | 326/30 |
| 6,087,853 | * 7/2000 | Huber et al. | 326/83 |

* cited by examiner

Primary Examiner—Michael Tokar
Assistant Examiner—Don Phu Le
(74) Attorney, Agent, or Firm—Sierra Patent Group, Ltd.

(57) ABSTRACT

A method for terminating signals in an information handling system comprises includes providing a plurality of resistance elements, providing at least three transmission lines each having a characteristic impedance, each of the transmission lines having a first end, each of the first ends being coupled together through said resistance elements, and a second end, and providing a plurality of drivers equaling the number of transmission lines in the plurality of transmission lines, each driver coupled to a second end of a different one of the transmission lines, each driver comprising a pull-down circuit having a pull-down resistance matched to the characteristic impedance of one of the lines, and a pull-up circuit having a pull-up resistance corresponding to the number of second ends. The method further includes providing at least one receiver circuit coupled to a second end of one of the transmission lines, designating one of the drivers as an active driver, and designating each driver in the plurality of drivers other than the active driver as a terminating driver. Finally, the method includes causing each terminating driver to be configured in a nonactive pull-down terminating configuration, and causing the active driver to drive a signal onto the transmission line to which the active driver is connected.

12 Claims, 6 Drawing Sheets

METHOD FOR OPERATING AN INFORMATION HANDLING SYSTEM

This is a continuation-in-part of U.S. patent application Ser. No. 08/881,925, filed on Jun. 25, 1997, now U.S. Pat. No. 5,982,191. This application relates to U.S. patent application Ser. No. 08/881,939 filed on Jun. 25, 1997, now U.S. Pat. No. 6,060,907.

This application relates to co-pending U.S. patent application Ser. No. 08/881,925, filed on Jun. 25, 1997, entitled Broadly Distributed Termination For Buses Using Switched Terminator Logic and naming Jonathan E. Starr as inventor, the application being incorporated herein by reference in its entirety.

This application relates to co-pending U.S. patent application Ser. No. 08/881,927, filed on Jun. 25, 1997, entitled Method of Broadly Distributed Terminator For Buses Using Switched Terminators and naming Jonathan E. Starr as inventor, the application being incorporated herein by reference in its entirety.

BACKGROUND OF THE INVENTION

1. Field of the Invention

The present invention relates to buses and more particularly to termination of buses for use in information processing systems.

2. Description of the Related Art

In computer and information processing systems, various integrated circuit chips communicate digitally with each other over a common bus. The signal frequency at which this communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to settle to levels that can be recognized reliably at the receiving bus nodes as being high or low, referred to as the settling time.

The length of the settling time is a function of the amount of reflection and ringing that occurs on the transmission line. The more effective the termination of a bus system, the smaller the effects of reflection and ringing in the system and the shorter the overall settling time of the signal.

SUMMARY OF THE INVENTION

A method for terminating signals in an information handling system comprises includes providing a plurality of resistance elements, providing at least three transmission lines each having a characteristic impedance, each of the transmission lines having a first end, each of the first ends being coupled together through said resistance elements, and a second end, and providing a plurality of drivers equaling the number of transmission lines in the plurality of transmission lines, each driver coupled to a second end of a different one of the transmission lines, each driver comprising a pull-down circuit having a pull-down resistance matched to the characteristic impedance of one of the lines, and a pull-up circuit having a pull-up resistance corresponding to the number of second ends. The method further includes providing at least one receiver circuit coupled to a second end of one of the transmission lines, designating one of the drivers as an active driver, and designating each driver in the plurality of drivers other than the active driver as a terminating driver. Finally, the method includes causing each terminating driver to be configured in a nonactive pull-down terminating configuration, and causing the active driver to drive a signal onto the transmission line to which the active driver is connected.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons having the benefit of this disclosure.

The use of the same reference symbols in different figures indicates similar or identical items.

Figure 1:
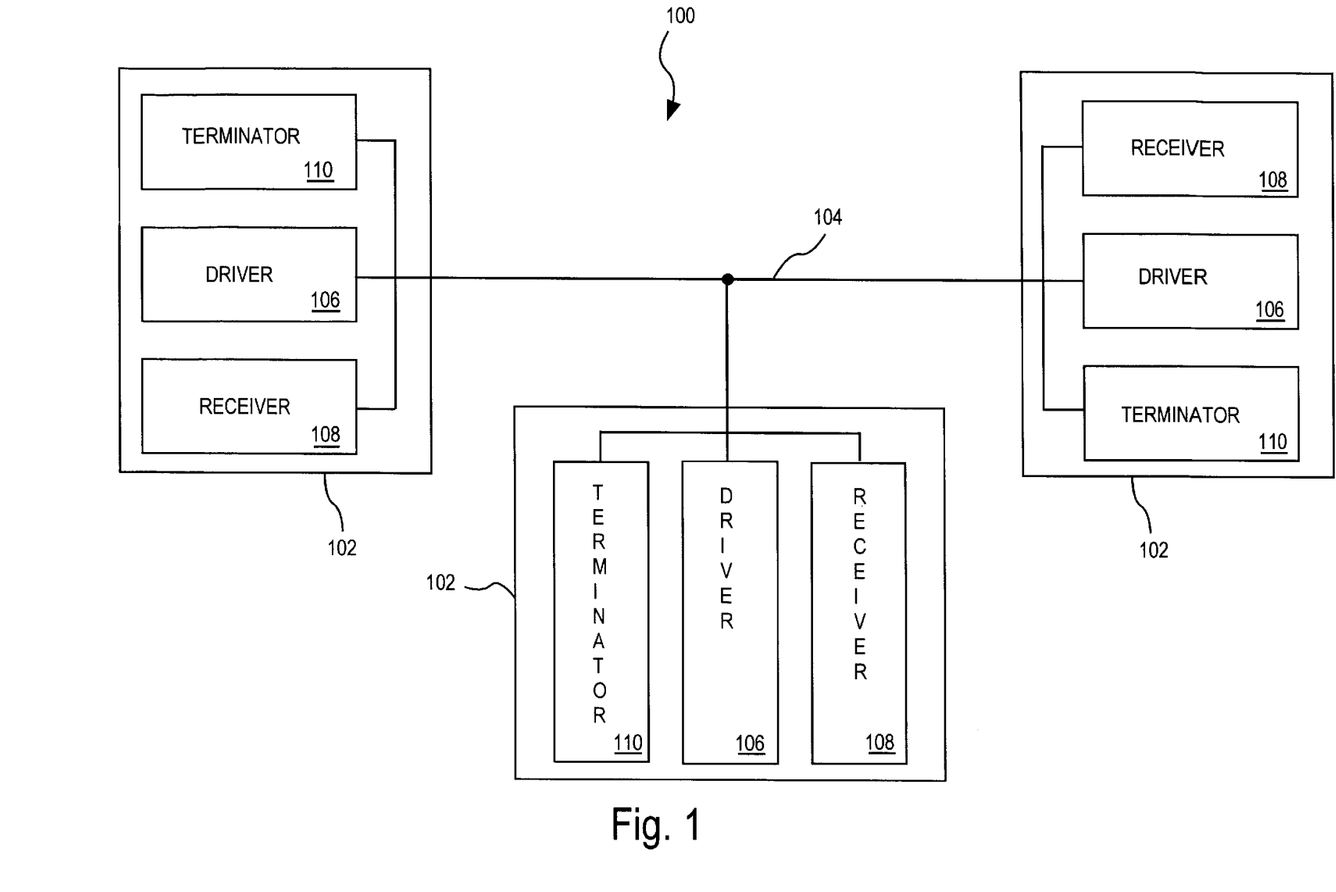
FIG. 1 is a block diagram of an information handling system having driver, receiver, and termination circuits in accordance with the present invention.

FIG. 1 is a block diagram of an information handling system having driver, receiver, and termination circuits in accordance with the present invention.

Referring to FIG. 1, information handling system 100 includes a plurality of devices 102 which communicate with each other over transmission lines 104.

Each component 102 includes a driver circuit 106, a receiver circuit 108 and an optional terminator circuit 110. The output resistance of each of driver circuits 106 is controlled using impedance control circuitry as is known in the art. One such means of controlling the output resistance of a driver is disclosed in U.S. patent application Ser. No. 08/881,939 filed on Jun. 25, 1997, entitled Impedance Control Circuit and Sai V. Vishwanthaiah, Jonathan E. Starr, and Alexander D. Taylor as inventors, the application being incorporated herein by reference in its entirety.

Herein, a node is defined as an endpoint of a transmission line which is not directly coupled to another transmission line. It may be coupled to one or more of a driver, receiver, or terminator circuit, or a combination of such circuits. For example, the system of FIG. 1 has three nodes.

A driver may comprise a pull-up circuit, a pull-down circuit, or both. A pull-up circuit, when enabled, couples the output node to the upper power rail through a controlled output resistance; when disabled it presents a high impedance to the output node. A pull-down circuit, when enabled, couples the output node to the lower power rail through a controlled output resistance; when disabled it presents a high impedance to the output node. A driver drives signals into the transmission line by selectively enabling and disabling its pull-up or pull-down circuits at the proper times.

In this disclosure, four different driver modes are possible. A driver referred to as "active" is a driver which is configured to drive a signal onto a transmission by selectively enabling and disabling its pull-up and pull-down circuits at the proper times. A nonactive driver in a pull-up terminating configuration is a driver having its pull-up circuit enabled and its pull-down circuit disabled. A nonactive driver in a pull-down terminating configuration is a driver having its pull-down circuit enabled and its pull-up circuit disabled. A high impedance mode is when a driver which is connected at a node having a separate terminator is not configured to drive a signal and both the pull-up and pull-down circuits are disabled. In this high impedance mode, an on-chip terminator is being used to terminate the transmission line.

In one embodiment, components 102 include terminators 110 which include an output resistance which is matched to the characteristic impedance of the transmission lines 104 and which is coupled to the transmission line 104 whenever the corresponding driver circuit 106 is not driving signals. When a terminator 110 is enabled, the corresponding driver circuit 106 provides a high impedance to the transmission line.

In this disclosure, when an output resistance is "matched" to the characteristic impedance of a transmission line, it is intended that the output resistance be within about ten percent of the characteristic impedance of the transmission line.

In a second embodiment, terminator 110 is not present. Rather, the output resistance of the driver itself is used to terminate the transmission line. That is, when not driving signals, the driver presents a terminating resistance to the line which is approximately equal to the impedance of the transmission line.

Whether an information handling system has a separate terminator circuit or instead incorporates the termination resistances into the driver circuitry, the effect on signals arriving at the end of the node is the same.

Figure 2:
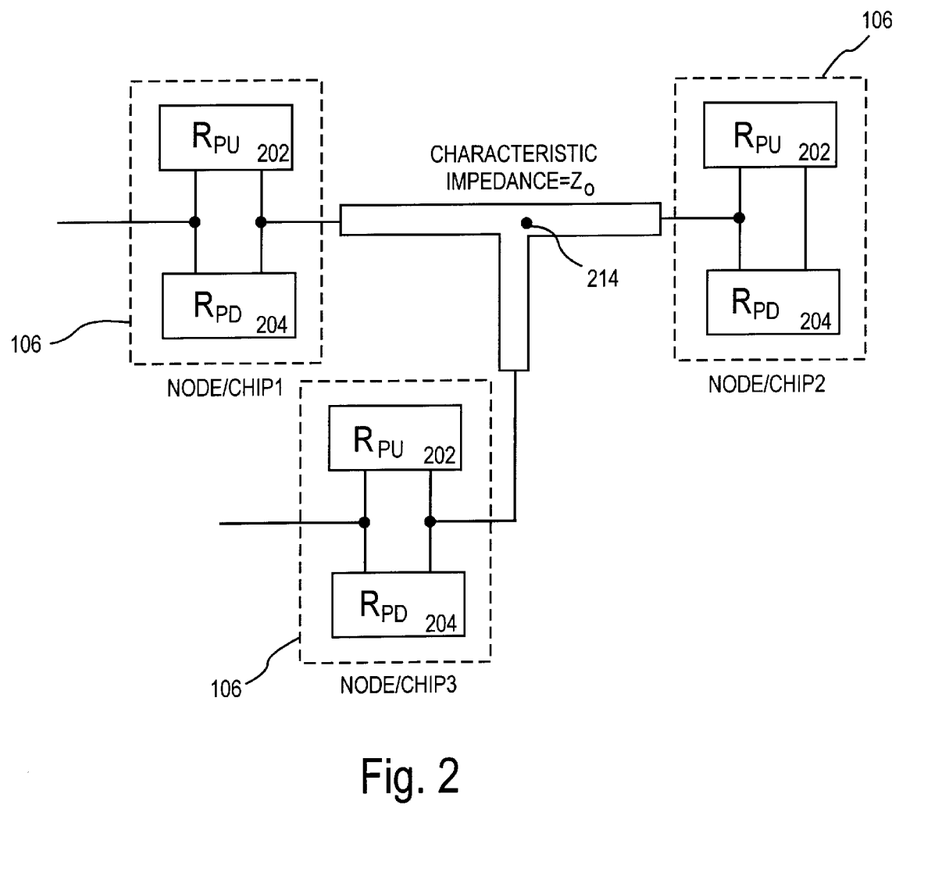
FIG. 2 is a block diagram of an information handling system according to the present invention.

FIG. 2 is a block diagram of an information handling system according to the present invention.

In the system of FIG. 2, an embodiment is described wherein the termination resistances are incorporated into the driver circuitry. That is, the driver output resistance is used to terminate the transmission line. Those of ordinary skill in the art who are familiar with the information contained herein would be able to practice either the FIG. 2 embodiment or an alternate embodiment which includes separate terminators 110 instead of incorporating the termination resistances into the drivers.

In the FIG. 2 embodiment, two distinct configurations are possible. In the first configuration, each non-driving node is connected to a corresponding driver whose pull-up circuit is enabled and acts to terminate the corresponding transmission line. In this first configuration, $R_{PU}$, the output resistance of the pull-up circuit, is approximately equal to the transmission line impedance and $R_{PD}$, the output resistance of the pull-down circuit, is approximately equal to a value computed using a formula to be described below.

In the second configuration of FIG. 2, each non-driving node is connected to a corresponding driver whose pull-down circuit is enabled and acts to terminate the corresponding transmission line. In this second configuration, $R_{PU}$, the output resistance of the pull-up circuit, is approximately equal to a value computed using a formula to be described below and $R_{PD}$, the output resistance of the pull-down circuit, is approximately equal to the transmission line impedance.

In both configurations, the termination resistance is approximately equal to the transmission line impedance, and the termination resistance is tied to the transmission line whenever the driver is not driving the line. When a node is in a driving configuration, the output resistance of the driver at any given moment is determined by either $R_{PU}$ which is the output resistance of the driver's pull-up circuit when it is enabled, or $R_{PD}$ which is the output resistance of the driver's pull-down circuit when it is enabled, or it is high impedance if neither the pull-up nor the pull-down circuit is enabled.

Referring to FIG. 2, each driver circuit 106 of information handling system 100 includes a pull-up circuit circuit 202 and a pull-down circuit circuit 204 coupled to transmission lines 104, transmission lines 104 having a characteristic impedance of $Z_0$.

When a node is driving signals onto transmission line 104, the driver 106 of the node either pulls the signal towards the upper power rail, pulls the signal towards the lower power rail or presents a high impedance to the output node, whichever is appropriate to send the desired signal. When a node is not driving, the pull-up portion (or pull-down portion, as appropriate) of the driver remains active, thereby providing a terminating resistance which is matched to the impedance of the transmission line.

Because the impedance at each non-driving node is matched to the impedance of the transmission line (due to the terminating resistance at the driver circuit present at a non-driving node), signals arriving at the non-driving node terminate without reflecting at that node. This condition is highly desirable because the settling time of the signal voltage level at the non-driving node is a critical parameter relating to bus performance. The net effect of the absence of reflections from the stub ends is a reduced overall settling time when compared to systems without termination at each non-driving node.

For the description which follows, it is assumed that any required termination resistance is supplied by a driver output resistance which is tied to the upper rail. Thus, $R_{PU}$, the output resistance of a driver in the pull-up configuration, is approximately equal to the transmission line impedance.

In the system of FIG. 2, the high signal voltage seen at a non-driving node is $V_{dd}$. $V_{dd}$ is the voltage of the upper power rail, and $V_{SS}$ is the voltage of the lower power rail. The low signal voltage seen at a non-driving node is $V_{dd} - V_{swing}$ where $V_{swing}$ is given by $$V_{swing} = (V_{dd} - V_{ss})([Z_0/(n-1)]/[\{Z_0/(n-1)\} + R]) \tag{R.1}$$

where R is the value of the pull-down resistance (shown as $R_{PD}$ in FIG. 2) and where n is the number of nodes in the information handling system 100. In the present invention, each node has a terminator or means for termination attached to it. The receivers are capable of resolving the swing.

Solving for R gives $$R = [Z_0([(V_{dd} - V_{ss})/V_{swing}] - 1)]/(n-1) \tag{R.2}$$

allowing for a particular pull-down resistance to be chosen for a desired $V_{swing}$.

As an example, in the system of FIG. 2, assume that a voltage swing of $(V_{dd} - V_{ss})/2$ is desired. Thus, pull down driver circuit 204 includes a pull-down resistance that is substantially equal to (i.e. within 10% of)

$$R = [Z_0([(V_{dd} - V_{ss})/V_{swing}] - 1)] - 1)]/(n-1) \quad \text{(from R.2)}$$
$$= [Z_0([(V_{dd} - V_{ss})/(V_{dd} - V_{ss})/2] - 1)]/(n-1)$$
$$= Z_0(2-1)/(n-1)$$
$$= Z_0/(n-1)$$

where n is the number of nodes in the information handling system 100.

Because the impedance at each non-driving node is matched to the impedance of the transmission line (due to the terminating resistance at the drivers located at those nodes), signals arriving at the non-driving node terminate without reflection. This condition is highly desirable because the settling time of the non-driving node is a critical parameter relating to bus performance. The net effect of the absence of reflections from the stub ends is a reduced overall settling time when compared to systems without termination at each non-driving node.

In the FIG. 2 configuration, by having the pull-up resistors on chip, the pull-up resistance at the driving node is switched off when the driver is pulling low. Accordingly, this system advantageously consumes less overall current and power than a system that has an off-chip pull-up resistor that is always drawing current.

When the termination of a node takes place outside component 102, the terminator is separated from the non-driving node by some distance along a transmission line and thus undesirable parasitics are introduced in the connection to the termination resistor. Also, because of the separation such a system can have reflections from the intersection of the stubs of the transmission line.

When the termination is within each component, the termination resistance is placed right at the receiver, thereby reducing reflections and ringing. Thus, providing the termination within each component 102 improves signal integrity when compared to terminating a node outside component 102.

Those of ordinary skill in the art will readily recognize that although the embodiment of FIG. 2 described herein relates to a system having the termination resistances tied to the upper rail, an alternate embodiment is contemplated which instead has the termination resistances tied to the lower rail. In this alternate embodiment, the pull-down resistance of each driver is approximately equal to the impedance of the transmission line and the pull-up resistance is approximately equal to the value of R given by relationship (R.2).

In an embodiment having separate terminators 110, the output resistance of the terminator is approximately equal to the impedance of the transmission line, and that resistance is connected to or disconnected from the transmission line, depending on whether the particular node is receiving or driving respectively. In this embodiment, the driver output at a non-driving node is high impedance when the node is in a receive condition.

Figure 3A:
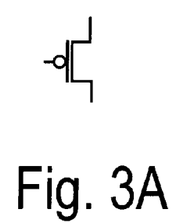
FIGS. 3A, 3B, 3C and 3D show schematic block diagrams of a variety of bit elements of the driver circuits in accordance with the present invention.
Figure 3B:
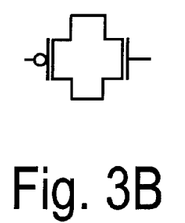
Figure 3C:
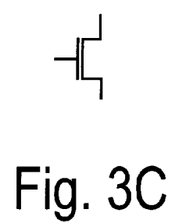
Figure 3D:
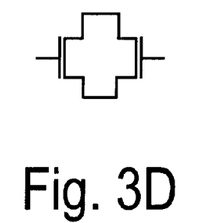

Referring to FIGS. 3A, 3B, 3C and 3D, the pull-up and pull-down elements of driver circuit 110 may be of a variety of configurations. For example, as shown in FIG. 3A, the driver element may be a PMOS transistor. Also for example, as shown in FIG. 3B, the driver element may be the parallel combination of a PMOS transistor and an NMOS transistor. With this parallel combination, it is the resistance of the parallel combination that would be equal to the desired bit element resistance. Also for example, as shown in FIG. 3C, the driver element may be an NMOS transistor. Also for example, as shown in FIG. 3D, the driver element may be the parallel combination of two NMOS transistors. In a preferred embodiment, the pull-up circuit element includes the parallel combination of the PMOS transistor and the NMOS transistor and the pull-down element includes the parallel combination of two NMOS transistors. It will be appreciated that a driver circuit may have other circuitry that contributes to the overall pull-up and pull-down resistance of the driver.

Figure 4:
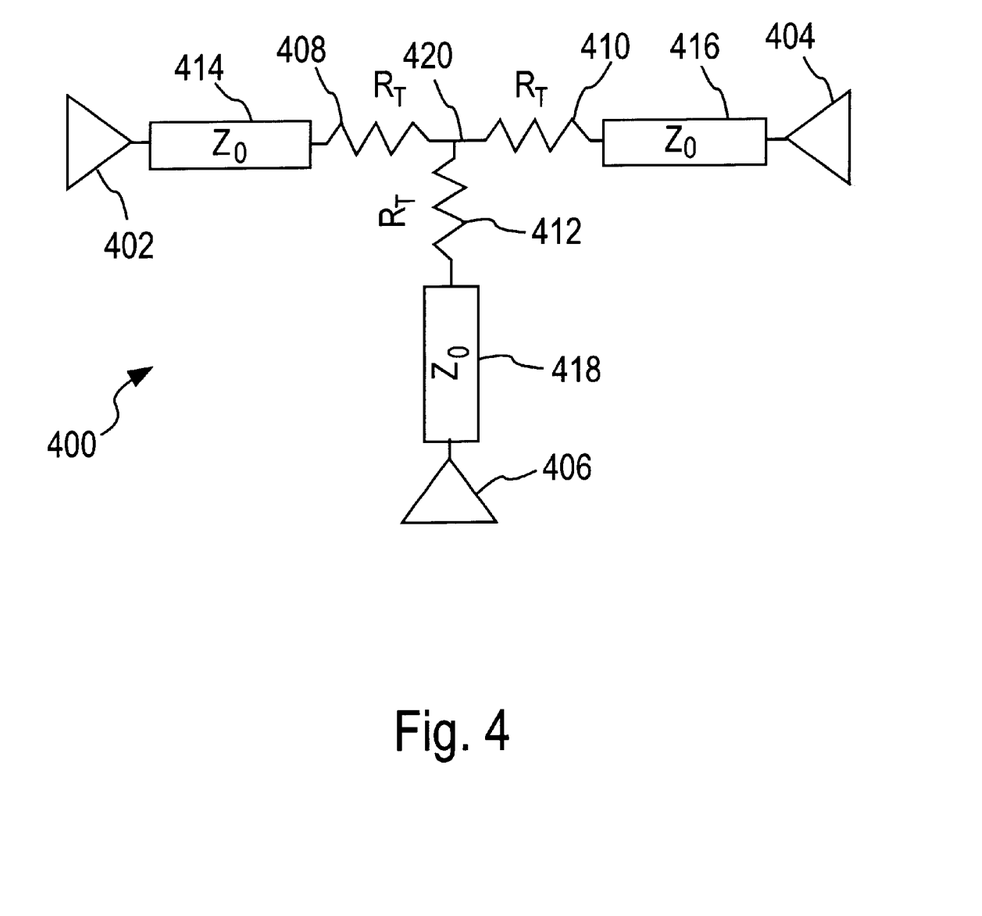
FIG. 4 is a block diagram of an alternate embodiment of the present invention.

FIG. 4 is a block diagram of an alternate embodiment of the present invention.

Referring to FIG. 4, system 400 comprises drivers 402, 404 and 406 individually coupled to resistance elements 408, 410, and 412 through transmission lines 414, 416, and 418, with each transmission line having a characteristic impedance $Z_0$ and each resistance element having a resistance of $R_T$. Drivers 402, 404, and 406 may include the example configuration of FIG. 2 where the pull-up circuit has an output resistance which approximately equals the characteristic impedance of the line, and the pull-down circuit has an output resistance which is inversely proportional to the number of nodes, or may instead comprise the reverse configuration described herein. Also, the system of FIG. 4 may use separate terminators as previously described in relation to FIG. 2.

To prevent signal reflections, the impedance looking into the resistive network from one of the transmission lines must match the impedance of the transmission line. For example, signals propagating from driver 402 on the transmission line 414 will not suffer reflections at the interface between line 414 and resistor 408 if the net impedance seen looking into resistor 408 at this interface is equal to the impedance of transmission line 414.

The impedance seen looking into resistor 408, 410, or 412 from the corresponding transmission line 414, 416, or 418 is $$Z_{network} = R_T + [(R_T + Z_0)/(n-1)] \quad \text{(R.3)}$$

Where n represents the number of nodes in the system. In order to prevent reflections, $$Z_{network} = Z_0 \quad \text{(R.4)}$$

In order to match impedances, relationship (R.4) is substituted into relationship (R.3), resulting in $$R_T = Z_0 \times [(n-2)/n] \quad \text{(R.5)}$$

Thus, in the three-node system of FIG. 4, each resistor in the resistor network has a value of $$R_T = Z_0 \times [(n-2)/n]$$
$$= Z_0 \times [(3-2)/3]$$
$$= Z_0/3 \text{ ohms}$$

Thus, a signal propagating away from any of drivers 402, 404, or 406 will see, looking into the resistor network, a net impedance of $$Z_{network} = R_T + 0.5 \times (R_T + Z_0) = Z_0/3 + 2Z_0/3 = Z_0$$

In the system of FIG. 4, the voltage swing at a non-driving node is given by $$V_{swing} = (V_{dd} - V_{ss})(Z_0/[(R+Z_0)(n-1)]) \quad (R.6)$$

where R is the output resistance of the driver pull-down circuit if the terminating resistances at non-driving nodes are coupled to the upper power rail; otherwise, R is the output resistance of the driver pull-up circuit if the terminating resistances at non-driving nodes are coupled to the lower power rail.

Using the previously described example configuration of FIG. 2 with the resistor network of FIG. 4, the value of the pull-down resistance is determined by solving relationship (R.6) for R, giving $$R = Z_0([(V_{dd} - V_{ss}) - V_{swing}(n-1)]/[V_{swing}(n-1)]). \quad (R.7)$$

In systems such as the system of FIG. 2 (lacking a resistive network such as that seen in FIG. 4), a signal propagating from a driver towards the common point 214 will see an impedance at the common point which is not matched to the impedance of the transmission line. Therefore, in those systems, a reflection would occur at common connection point 214. The magnitude of that reflection increases as the impedance mismatch increases. In systems employing the embodiment of FIG. 4, the impedance seen at the connection point between the resistor and the transmission line by a signal propagating from a node to common connection point 420 is equal to the impedance of the transmission line, so no reflection occurs. Since no reflection occurs, a second signal may be sent sooner than otherwise possible, thus increasing signaling frequency of the system.

A significant benefit resulting from using the FIG. 4 embodiment of the present invention is that signals may be pipelined. Pipelining is when a signal is launched on a signal conductor prior to the most recently launched signal arriving at a receiving end. In some systems, including the system of FIG. 2, in order to transmit a signal, it may be necessary to wait until the magnitudes of the reflections on the driver stub resulting from a previously launched signal reflecting from the junction have diminished enough to not interfere with subsequently launched signals. Using the system of FIG. 4, there are no reflections. Therefore a signal may be launched by a driver prior to the time a previously launched signal has arrived at the receiving ends.

A second benefit of the FIG. 4 embodiment is that the voltage present at any given time on the lines will not exceed the driving voltage, $V_{dd}$.

Figure 5A:
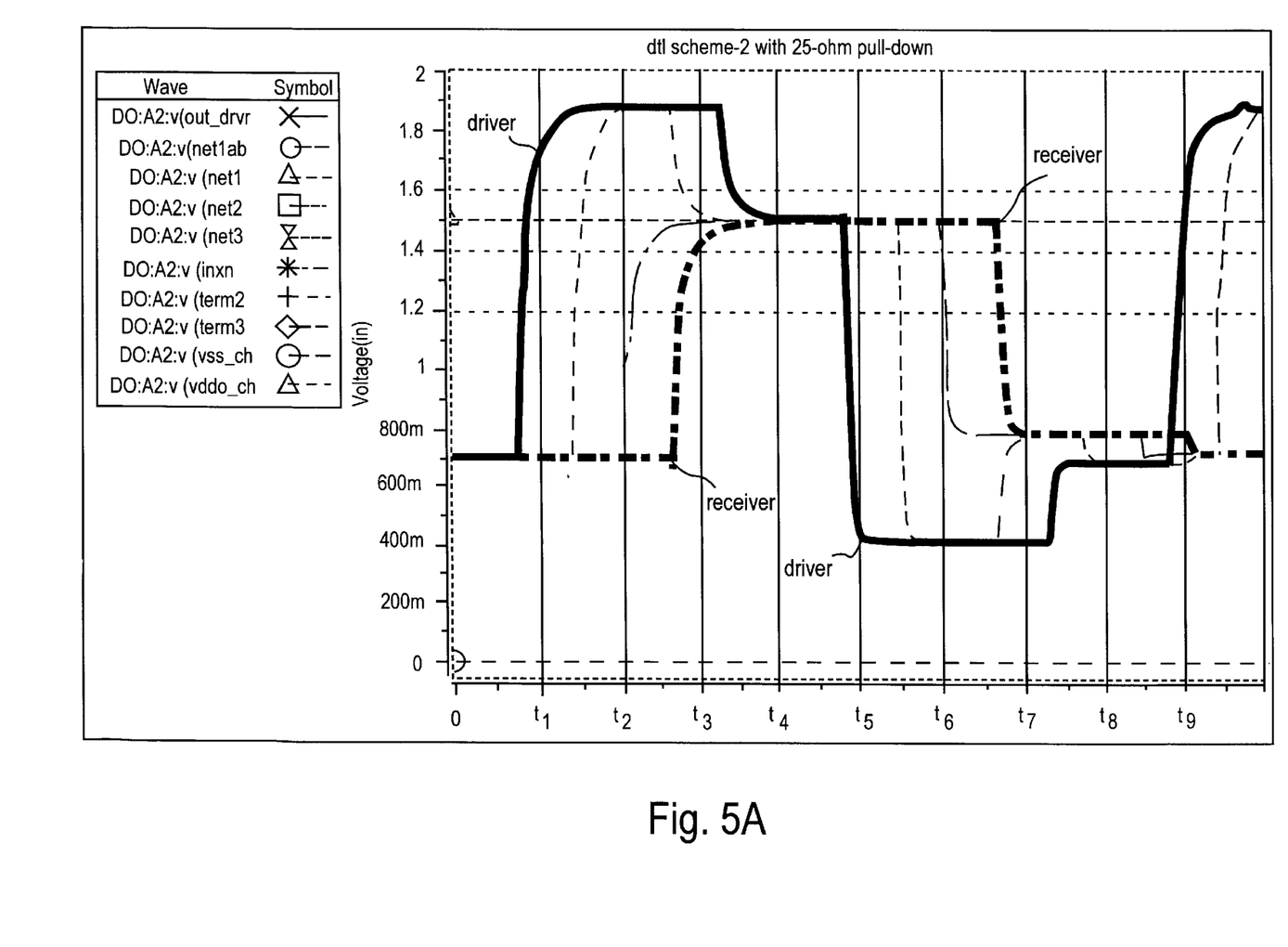
FIG. 5A is a signal response curve for a system as depicted in FIG. 2 showing a voltage overshoot condition.
Figure 5B:
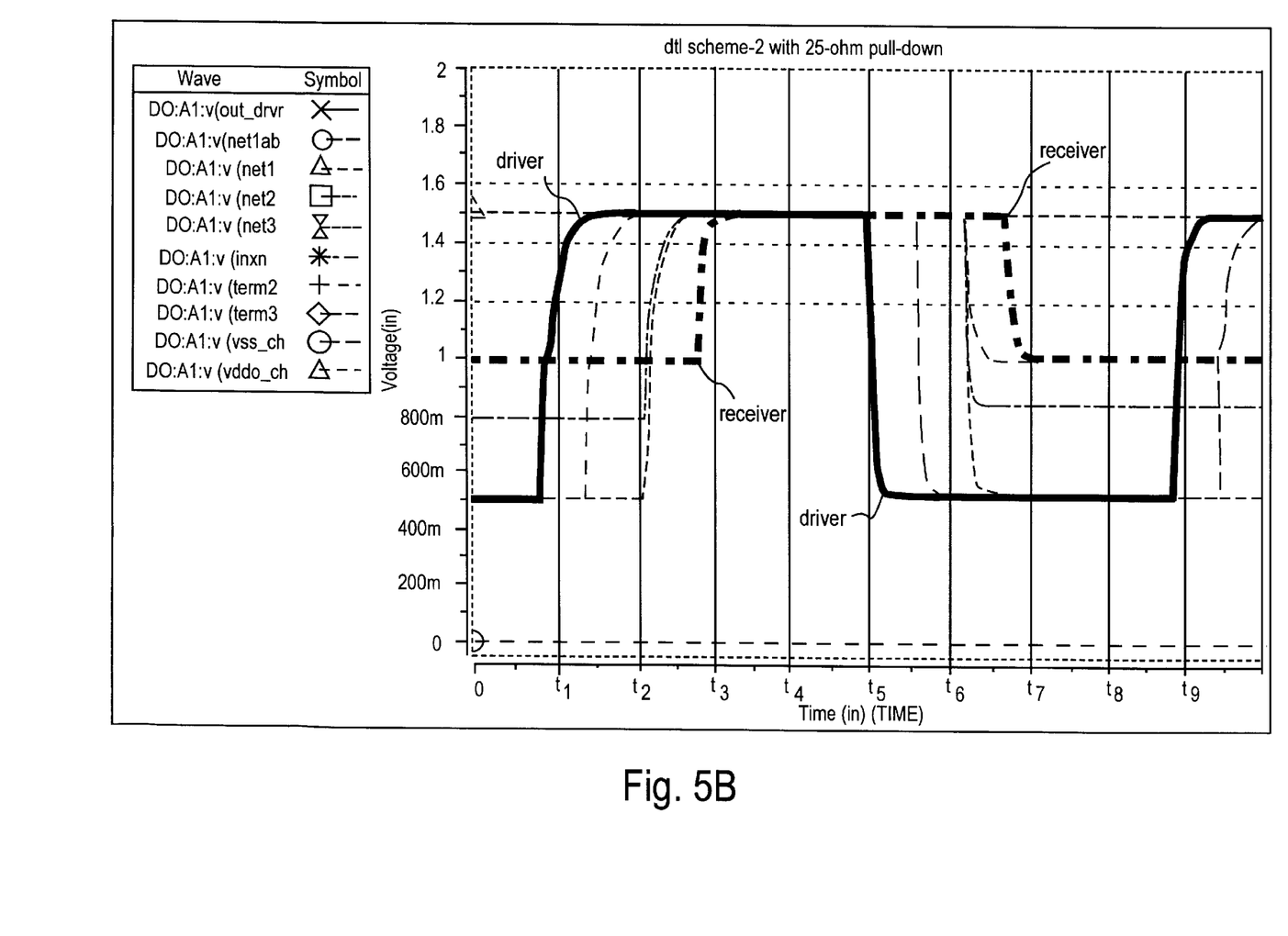
FIG. 5B is a signal response curve for a system such as is depicted in FIG. 4.

FIG. 5A is a signal response curve for a system as depicted in FIG. 2 showing a voltage overshoot condition. FIG. 5B is a signal response curve for a system such as is depicted in FIG. 4.

Both signal response curves show the voltage at the driving and receiving ends where $V_{dd}$=1.5 V, $V_{ss}$=0 V, the transmission line impedance is 50 ohms, the pull-down resistance is 25 ohms, and the pull-up resistance is 50 ohms.

Referring to FIG. 5A, from time $t_0$ to just prior to time $t_1$, the driver is pulling low. While the driver, assumed to be chip 1 of FIG. 2, is pulling low, there is a 25 ohm pull-down resistance in series with a parallel combination of the 50 ohm pull-up resistance of chip 2 of FIG. 2, and a 50 ohm pull-up resistance of chip 3 of FIG. 2. Therefore, the current is $V_{dd}/R$=1.5 V/50 ohms=30 ma. The initial voltage at all driver and receiver ends is $V_{dd}/2$.

At approximately time $t_1$, the driver no longer pulls low, and is in the transition stage to pulling high. At this time, the 30 ma current flow stops, giving a $\Delta I$ of 30 ma. Since $Z_0$=50 ohms, there is a $\Delta V$ of $(Z_0)(\Delta I)$=1.5 V. Now, the total voltage at the driving end is the sum of the initial voltage plus $\Delta V$=0.75 V+1.5 V=2.25 V. However, when the 50 ohm pull-up element turns on, there is a 1:1 voltage divider between the pull-up resistance and the line, resulting in a divider between 1.5 V and 2.25 V, resulting in a total line voltage of 1.875 V. Thus, the total voltage on the line exceeds $V_{dd}$.

Between time $t_1$ and just after time $t_3$, the voltage on the line overshoots $V_{dd}$, and could cause damage to driving elements that are not protected against such damage.

At approximately time $t_2$, the driven signal arrives at junction 214. Due to the impedance mismatch there, a negative reflection of the signal propagates back towards the driver. It is the reflected signal which, upon arriving back at the driver, brings the voltage at the driver end down from the overshoot condition seen at approximately times $t_1$ to $t_3$ to $V_{DD}$ at approximately time $t_4$.

Although the example signal response curve for FIG. 5A pertains to a system having a total of three nodes, the curve of FIG. 5A also generally applies to systems having more nodes than three. The primary difference in the curve for many nodes would be the actual overshoot voltage.

FIG. 5B utilizes the configuration described with respect to FIG. 4. As shown, this new configuration does not have an overshoot condition which would otherwise damage components that are not sturdy enough to tolerate a voltage overshoot without becoming damaged.

Referring to FIG. 5B, from time $t_0$ to just prior to time $t_1$, the driver is pulling low.

It can be shown that the driver current is given by $$I_{driver} = V_{dd}/(R+Z_0) \quad (R.8)$$

The voltage out of the driver at time $t_0$ is simply the current multiplied by the driver resistance R, giving $$V_{driver} = [V_{dd}/(R+Z_0)]R \quad (R.9)$$

Thus, when the driver stops pulling low, the change in current is given by relationship (R.8). The change in voltage in the system is $$\begin{aligned}\Delta V &= Z_0(\Delta I) \\ &= Z_0[V_{dd}/(R+Z_0)]\end{aligned} \quad (R.10)$$

The voltage after the driver stops pulling low is merely the sum of the original voltage and the change in voltage (R.9 and R.10), giving $$\begin{aligned}&= [V_{dd}/(R+Z_0)]R + Z_0[V_{dd}/(R+Z_0)] \\ &= (R+Z_0)[V_{dd}/(R+Z_0)] \\ &= V_{dd}\end{aligned}$$

showing that there is no overshoot with the system of FIG. 4.

Although the example signal response curve for FIG. 5B pertains to a system having a total of three nodes, the curve of FIG. 5B also generally applies to systems having more nodes than three.

Those of ordinary skill in the art will readily recognize that although the examples given herein have employed three nodes, systems having more nodes than three are contemplated.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for operating an information handling system comprising:

provided a plurality of resistance elements;

providing at least three transmission lines having a characteristic impedance, each of said transmission lines having a first end, said first ends being coupled together through different ones of said resistance elements, and a second end;

providing a plurality of drivers equaling the number of transmission lines in said plurality of transmission lines, each driver coupled to a second end of a different one of said transmission lines, each driver comprising a pull-down circuit having a pull-down resistance matched to the characteristic impedance of one of said lines, and a pull-up circuit having a pull-up resistance corresponding to the number of second ends;

providing at least one receiver circuit coupled to a second end of one of said transmission lines;

designating one of said drivers as an active driver;

designating each driver in said plurality of drivers other than said active driver as a terminating driver;

causing each terminating driver to be configured in a nonactive pull-down terminating configuration; and causing said active driver to drive a signal onto the transmission line to which said active driver is connected.

2. The method of claim 1 wherein providing a plurality of resistance elements further comprises providing a plurality of resistance elements having a resistance value which is within ten percent of the result of multiplying the characteristic impedance of said transmission lines by $[(n-2)/n]$ where n is the number of the transmission lines in the system.

3. The method of claim 2 wherein providing a plurality of drivers further comprises providing at least one driver comprising a pull-up circuit having an output resistance within ten percent of the result of computing $Z_0([(V_{dd}-V_{ss})-V_{swing}(n-1)]/[V_{swing}(n-1)])$, $Z_0$ representing the characteristic impedance of said transmission lines, n representing the number of second ends, $V_{dd}$ representing the voltage at an upper rail, $V_{ss}$ representing the voltage at a lower rail, and $V_{swing}$ representing the voltage swing desired at a second end not connected to an active driver when each second end in the system is terminated to a lower rail; and designating one of said drivers as an active driver further comprises designating one of said drivers comprising a pull-up circuit having an output resistance within ten percent of the result of computing $Z_0([(V_{dd}-V_{ss})-V_{swing}(n-1)]/[V_{swing}(n-1)])$ as an active driver, the designated active driver.

4. A method for operating an information handling system comprising:

providing a plurality of resistance elements;

providing at least three transmission lines having a characteristic impedance, each of said transmission lines having a first end, said first ends being coupled together through different ones of said resistance elements, and a second end;

providing a plurality of drivers equaling the number of transmission lines in said plurality of transmission lines, each driver coupled to a second end of a different one of said transmission lines, each driver comprising a pull-up circuit having a pull-up resistance matched to the characteristic impedance of one of said lines, and a pull-down circuit having a pull-down resistance corresponding to the number of second ends;

providing at least one receiver circuit coupled to a second end of one of said transmission lines;

designating one of said drivers as an active driver;

designating each driver in said plurality of drivers other than said active driver as a terminating driver;

causing each terminating driver to be configured in a nonactive pull-up terminating configuration; and causing said active driver to drive a signal onto the transmission line to which said active driver is connected.

5. The method of claim 4 wherein providing a plurality of resistance elements further comprises providing a plurality of resistance elements having a resistance value which is within ten percent of the result of multiplying the characteristic impedance of said transmission lines by $[(n-2)/n]$ where n is the number of the transmission lines in the system.

6. The method of claim 5 wherein providing a plurality of drivers further comprises providing at least one driver comprising a pull-down circuit having an output resistance within ten percent of the result of computing $Z_0([(V_{dd}-V_{ss})-V_{swing}(n-1)]/[V_{swing}(n-1)])$, $Z_0$ representing the characteristic impedance of said transmission lines, n representing the number of second ends, $V_{dd}$ representing the voltage at an upper rail, $V_{ss}$ representing the voltage at a lower rail, and $V_{swing}$ representing the voltage swing desired at a second end not connected to an active driver when each second end in the system is terminated to an upper rail; and designating one of said drivers as an active driver further comprises designating one of said drivers comprising a pull-down circuit having an output resistance within ten percent of the result of computing $Z_0([(V_{dd}-V_{ss})-V_{swing}(n-1)]/[V_{swing}(n-1)])$ as an active driver.

7. A method for operating an information handling system comprising:

providing a plurality of resistance elements;

providing at least three transmission lines having a characteristic impedance, each of said transmission lines having a first end, said first ends being coupled together through different ones of said resistance elements, and a second end;

providing at least one driver, each coupled to a second end of a different one of said transmission lines, each driver comprising a pull-down circuit having a pull-down resistance matched to the characteristic impedance of one of said lines, and a pull-up having a pull-up resistance corresponding to the number of second ends;

providing at least one receiver circuit coupled to a second end of one of said transmission lines;

providing a plurality of on-chip terminators each having an output resistance matched to the characteristic impedance of said transmission lines; designating one of said drivers as an active driver;

causing each transmission line not connected to said active driver to be terminated to a lower rail by one of the following: an on-chip terminator, a nonactive driver in a pull-down terminating configuration; and causing said active driver to drive a signal onto the transmission line to which said active driver is connected.

8. The method of claim 7 wherein providing a plurality of resistance elements further comprises providing a plurality of resistance elements having a resistance value which is within ten percent of the result of multiplying the characteristic impedance of said transmission lines by $[(n-2)/n]$ where n is the number of the transmission lines in the system.

9. The method of claim 8 wherein providing a plurality of drivers further comprises providing at least one driver comprising a pull-up circuit having an output resistance within ten percent of the result of computing $Z_0([(V_{dd}-V_{ss})-V_{swing}(n-1)]/[V_{swing}(n-1)])$, $Z_0$ representing the characteristic impedance of said transmission lines, n representing the number of second ends, $V_{dd}$ representing the voltage at an upper rail, $V_{ss}$ representing the voltage at a lower rail, and $V_{swing}$ representing the voltage swing desired at a second end not connected to an active driver when each second end in the system is terminated to a lower rail; and designating one of said drivers as an active driver further comprises designating one of said drivers comprising a pull-up circuit having an output resistance within ten percent of the result of computing $Z_0([(V_{dd}-V_{ss})-V_{swing}(n-1)]/[V_{swing}(n-1)])$ as an active driver.

10. A method for operating an information handling system comprising:

providing a plurality of resistance elements;

providing at least three transmission lines having a characteristic impedance, each of said transmission lines having a first end, said first ends being coupled together through different ones of said resistance elements, and a second end;

providing at least one driver, each driver coupled to a second end of a different one of said transmission lines, each driver comprising a pull-up circuit having a pull-up resistance matched to the characteristic impedance of one of said lines, and a pull-down circuit having a pull-down resistance corresponding to the number of second ends;

providing at least one receiver circuit coupled to a second end of one of said transmission lines;

providing a plurality of on-chip terminators each having an output resistance matched to the characteristic impedance of said transmission lines;

designating one of said drivers as an active driver;

causing each transmission line not connected to said active driver to be terminated to an upper rail by one of the following: an on-chip terminator, a nonactive driver in a pull-up terminating configuration; and causing said active driver to drive a signal onto the transmission line to which said active driver is connected.

11. The method of claim 10 wherein providing a plurality of resistance elements further comprises providing a plurality of resistance elements having a resistance value which is within ten percent of the result of multiplying the characteristic impedance of said transmission lines by $[(n-2)/n]$ where n is the number of the transmission lines in the system.

12. The method of claim 11 wherein providing a plurality of drivers further comprises providing at least one driver comprising a pull-down circuit having an output resistance within ten percent of the result of computing $Z_0([(V_{dd}-V_{ss})-V_{swing}(n-1)]/[V_{swing}(n-1)])$, $Z_0$ representing the characteristic impedance of said transmission lines, n representing the number of second ends, $V_{dd}$ representing the voltage at an upper rail, $V_{ss}$ representing the voltage at a lower rail, and $V_{swing}$ representing the voltage swing desired at a second end not connected to an active driver when each second end in the system is terminated to an upper rail; and designating one of said drivers as an active driver further comprises designating one of said drivers comprising a pull-down circuit having an output resistance within ten percent of the result of computing $Z_0([(V_{dd}-V_{ss})-V_{swing}(n-1)]/[V_{swing}(n-1)])$ as an active driver.

* * * * *

UNITED STATES PATENT AND TRADEMARK OFFICE
CERTIFICATE OF CORRECTION

PATENT NO. : 6,188,238 B1
DATED : February 13, 2001
INVENTOR(S) : Jonathan E. Starr It is certified that error appears in the above-identified patent and that said Letters Patent is hereby corrected as shown below:

Column 8,
Line 1, -- At approximately time $t_1$, the driver no longer pulls low, and is in the transition stage to pulling high. At this time, the 30ma 'current flow stops, giving a $\Delta I$ of 30ma. Since $Z_0 = 50$ ohms, there is a $\Delta V$ of $(Z_0)(\Delta I) = 1.5V$. Now, the total voltage at the driving end is the sum of the initial voltage plus $\Delta V = 0.75V + 1.5V = 2.25V$. However, when the 50 ohm pull-up element turns on, there is a 1:1 voltage divider between the pull-up resistance and the line, resulting in a divider between 1.5V and 2.25V, resulting in a total line voltage of 1.875V. Thus, the total voltage on the line exceeds $V_{dd}$. --

Signed and Sealed this

Thirtieth Day of April, 2002

*Attest:*

*Attesting Officer*

JAMES E. ROGAN
*Director of the United States Patent and Trademark Office*